US006404256B2

United States Patent
Minami et al.

(10) Patent No.: US 6,404,256 B2
(45) Date of Patent: *Jun. 11, 2002

(54) SYNCHRONOUS DELAY CIRCUIT

(75) Inventors: Koichiro Minami; Takanori Saeki; Masashi Nakagawa, all of Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/375,199

(22) Filed: Aug. 16, 1999

(30) Foreign Application Priority Data

Aug. 14, 1998 (JP) .......................................... 10-229212

(51) Int. Cl.[7] .............................................. H03H 11/26
(52) U.S. Cl. ....................................... 327/276; 327/277
(58) Field of Search ................................ 327/276, 277, 327/278, 281, 288, 263, 264, 269, 270, 271, 272

(56) References Cited

U.S. PATENT DOCUMENTS

| 4,473,762 | A | | 9/1984 | Iwahashi et al. ............ 327/262 |
| 4,742,254 | A | * | 5/1988 | Tomisawa .................... 327/261 |
| 4,797,585 | A | * | 1/1989 | Segawa et al. .............. 327/261 |
| 4,905,192 | A | * | 2/1990 | Nogami et al. .............. 365/200 |
| 5,272,453 | A | | 12/1993 | Trayhor et al. ................ 331/57 |
| 5,285,483 | A | | 2/1994 | Ogawa et al. ................ 375/120 |
| 5,313,438 | A | | 5/1994 | Hieda et al. ................. 365/238 |
| 5,355,037 | A | * | 10/1994 | Andresen et al. ............ 327/261 |
| 5,440,260 | A | * | 8/1995 | Hayashi et al. .............. 327/278 |
| 5,606,292 | A | | 2/1997 | Oh .............................. 351/57 |
| 6,075,395 | A | * | 6/2000 | Saeki .......................... 327/161 |

FOREIGN PATENT DOCUMENTS

| JP | 61-39721 | | 2/1986 | |
| JP | 362247619 | * | 10/1987 | ................. 327/263 |
| JP | 3-94511 | | 4/1991 | |
| JP | 404135311 | * | 5/1992 | ................. 327/261 |

OTHER PUBLICATIONS

Okajima, et al., "Digital Delay Locked Loop and Design Technique for High–Speed Synchronous Interface", Jun. 1996, pp. 798–807, IEICE Trans. Electron, vol. E79–C, No. 6.

Okajima, Y. et al., "Digital Delay Locked Loop and Design Technique for High–Speed Synchronous Interface", IEICE Trans. Electron, vol. E79–C, No. 6, Jun. 1996, pp. 798–807.

* cited by examiner

*Primary Examiner*—Tuan T. Lam
(74) *Attorney, Agent, or Firm*—Hutchins, Wheeler & Dittmar

(57) ABSTRACT

In a synchronous delay circuit including a first delay circuit array which is constituted of a plurality of cascade-connected delay circuit stages, and a second delay circuit array which is constituted of a plurality of cascade-connected delay circuit stages arranged to have a signal propagating direction opposite to that of the first delay circuit array. Each of the delay circuit stages of the first and second delay circuit arrays includes a CMOS inverter receiving an input signal. A P-channel MOS transistor of the CMOS inverter, a switching P-channel MOS transistor and an additional resistor are connected in series between a power supply line and an output node of the delay circuit stage. An N-channel MOS transistor of the CMOS inverter, a switching N-channel MOS transistor and another additional resistor are connected in series between the ground and the output node of the delay circuit stage. Thus, the current drive capability of each unitary delay circuit is decreased by the additional resistors, so that the delay time per one unitary delay circuit can be increased while minimizing the increase of the jitter. Accordingly, the area of the delay circuit arrays required to obtain a desired delay time can be reduced.

3 Claims, 13 Drawing Sheets

SYNCHRONOUS DELAY CIRCUIT

BACKGROUND OF THE INVENTION

1. Field of the Invention

The present invention relates to a synchronous delay circuit, and more specifically to a synchronous delay circuit having a reduced number of delay circuit stages in a delay circuit array by suppressing an increase of jitter.

2. Description of Related Art

As a background of the synchronous delay circuit to which the present invention is directed, a circuit for generating an internal clock in synchronism with an external clock by use of a delay circuit array used for measuring a time difference and another delay circuit array for reproducing a delay time corresponding to the measured time difference, will be described with reference to FIG. 1, which however illustrates one embodiment of the synchronous delay circuit in accordance with the present invention.

Referring to FIG. 1, the shown circuit includes a delay circuit array 101 used for measuring a time difference, another delay circuit array 102 for reproducing a delay time corresponding to the measured time difference, an input buffer 103 for receiving an external clock 106, a clock driver 104 for outputting an internal clock 107, and a dummy delay circuit 105 having a delay time corresponding to a sum of a delay time "td1" of the input buffer 103 and a delay time "td2" of the clock driver 104.

The delay circuit array 101 and the delay circuit array 102 are located in parallel to each other but to have a signal propagating direction opposite to each other in a synchronous delay circuit macro 108. The dummy delay circuit, 105 includes an input buffer dummy 105A constituted of completely the same circuit as the input buffer 103 (and therefore having the delay time "td1") and a clock driver dummy 105B constituted of completely the same circuit as the clock driver 104 (and therefore having the delay time "td2"). The external clock (having the period of tCK) is caused to pass the input buffer 103 (delay time=td1) the dummy delay circuit (delay time=td1+td2), the synchronous delay circuit macro 108 (delay time 2×{tCK−(td1+td2)}), and the clock driver 104 (delay time=td2), so that the external clock is outputted as the internal clock 107. Therefore, the internal lock k107 has a delay time of 2tCK.

In the synchronous delay circuit, since the delay amount of tV=tCK−(td1+td2) is measured by knowing to which position an input signal advances in the delay circuit array 101, assuming that the delay time of the whole of the delay circuit array 101 is tDL, a maximum value of an operable period tCK becomes td1+td2+tDL.

Here, since the delay times td1 and td2 are determined by the input buffer 103 and the clock driver 104, the maximum value of the clock period tCK is determined by tDL.

On the other hand, the delay circuit arrays occupy a large area in the synchronous delay circuit. Therefore, it has been required to reduce the area of the delay circuit arrays by decreasing the number of delay circuit stages in the delay circuit array, while ensuring the maximum delay time tDL.

For example, in a prior art delay circuit disclosed by Y. OKAJIMA et al "Digital Delay Locked Loop and Design Technique for High-Speed Synchronous Interface", IEICE TRANS. ELECTRON., Vol. E79-C, No. 6, June 1996, pp798–807 (the content of which is incorporated by reference in its entirety into this application), if it is attempted to increase the delay time of each unitary delay circuit stage, it is considered to add a capacitor 1309 to the unitary delay circuit, as shown in FIG. 14. FIG. 14 illustrates one unitary delay circuit of each of the delay circuit arrays 101 and 102 shown in FIG. 1.

In brief, a unitary delay circuit of the delay circuit arrays 101 is designated with reference number 1 and is constituted of a clocked inverter including two P-channel MOS transistors 1301 and 1302 and two N-channel MOS transistors 1303 and 1304 connected in series in the named order between a high voltage power supply line VDD and ground GND. A unitary delay circuit of the delay circuit arrays 102 is designated with reference number 2 and is also constituted of a clocked inverter including two P-channel MOS transistors 1305 and 1306 and two N-channel MOS transistors 1307 and 1308 connected in series in the named order between the high voltage power supply line VDD and the ground GND. The capacitor 1309 is connected to an connection node between an output of the unitary delay circuit 1 and an input of the unitary delay circuit 2. With this addition of the capacitor, it is possible to increase the delay time of the unitary delay circuit, and therefore, it is possible to reduce the number of delay circuit stages in the delay circuit array.

However, if the delay time of the unitary delay circuit is increased by adding the capacitor to an output of each of cascade-connected unitary delay circuits, another problem is encountered in which a jitter increases as shown in FIG. 7.

The reason for this is as follows: The jitter is in proportion to a difference between a charging time through the P-channel MOS transistors included in the delay circuit and a discharging time through the N-channel MOS transistors included in the delay circuit. Therefore, if the capacitor is added between the unitary delay circuits as shown in FIG. 14, the charging time through the P-channel MOS transistor and the discharging time through the N-channel MOS transistor are respectively increased in the same way, with the result that the difference between the charging time and the discharging time is correspondingly increased, and therefore, the jitter becomes large.

SUMMARY OF THE INVENTION

Accordingly, it is an object of the present invention to provide a synchronous delay circuit which has overcome the above mentioned problem of the prior art.

Another object of the present invention is to provide a synchronous delay circuit having a reduced number of delay circuit stages in a delay circuit array by suppressing an increase of jitter.

The above and other objects of the present invention are achieved in accordance with the present invention by a synchronous delay circuit wherein a unitary delay circuit of a delay circuit array is constituted of a clocked inverter having a current limiting means inserted in series in an output node charging/discharging current path.

In one preferred embodiment of the synchronous delay circuit in accordance with the present invention, each of a plurality of unitary delay circuits included in one delay circuit array includes a CMOS inverter receiving an input signal. A P-channel MOS transistor of the CMOS inverter, a switching P-channel MOS transistor on-off controlled by a control signal, and a current limiting means are connected in series between a high voltage power supply line and an output node of the unitary delay circuit stage. An N-channel MOS transistor of the CMOS inverter, a switching N-channel MOS transistor on-off controlled by an inverted signal of the control signal, and another current limiting means are connected in series between the ground and the output node of the unitary delay circuit stage.

Specifically, the synchronous delay circuit includes a first delay circuit array which is constituted of a plurality of cascade-connected delay circuit stages, and a second delay circuit array which is constituted of a plurality of cascade-connected delay circuit stages arranged to have a signal propagating direction opposite to that of the first delay circuit array. Each of the delay circuit stages of the first and second delay circuit arrays is constituted of the above mentioned unitary delay circuit.

With the above mentioned arrangement, since a current drive capability of each unitary delay circuit is decreased by adding the current limiting means to each unitary delay circuit, a delay time per one unitary delay circuit can be increased, so that the number of unitary delay circuit stages in the delay circuit array required to obtain a desired delay time can be reduced, and therefore the area of the delay circuit array can also be reduced.

On the other hand, since the current drive capability of each unitary delay circuit is decreased by adding the current limiting means to each unitary delay circuit, the difference between the charging time through the P-channel MOS transistor and the discharging time through the N-channel MOS transistor does not relatively become large. Therefore, the increase of the jitter is prevented.

For example, the current limiting means can be constituted of a resistor or a CMOS transfer gate inserted in series in a charging/discharging current path of each unitary delay circuit.

In an embodiment of the synchronous delay circuit in accordance with the present invention, a delay circuit array is constituted of alternately cascade-connecting a plurality of first clocked inverters each composed of P-channel MOS transistors and a plurality of second clocked inverters each composed of N-channel MOS transistors, each of the clocked inverters having a current limiting means inserted in series in a charging/discharging current path of the clocked inverter.

In this embodiment of the synchronous delay circuit, since a current drive capability of each clocked inventor (unitary delay circuit) is decreased by adding the current limiting means to each unitary delay circuit, a similar advantage can be obtained.

The above and other objects, features and advantages of the present invention will be apparent from the following description of preferred embodiments of the invention with reference to the accompanying drawings.

DESCRIPTION OF THE PREFERRED EMBODIMENTS

Figure 1:
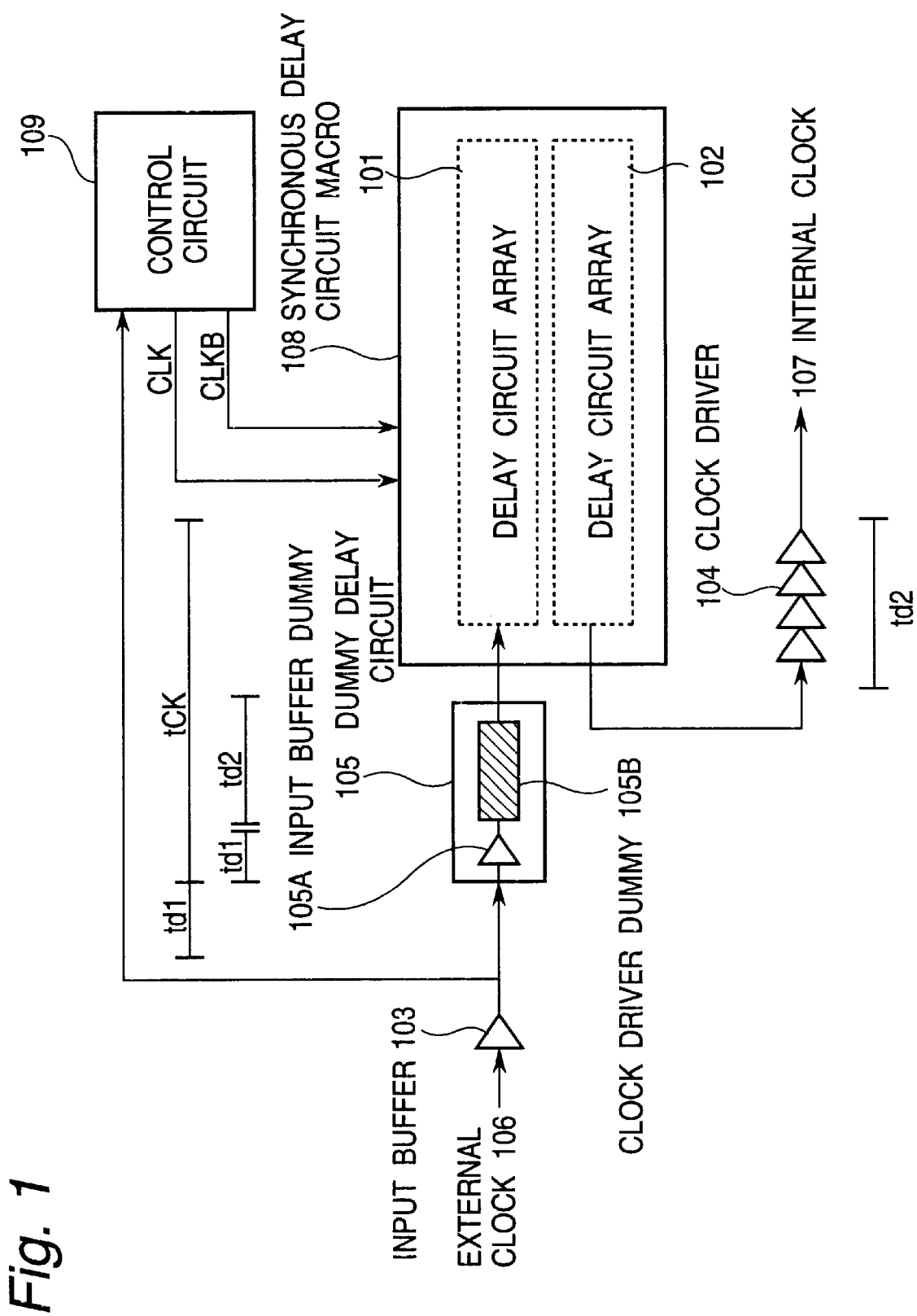
FIG. 1 illustrates an overall structure of the synchronous delay circuit in accordance with the present invention.

Referring to FIG. 1, there is shown an overall structure of one embodiment of the synchronous delay circuit in accordance with the present invention. Referring to FIG. 1, the shown synchronous delay circuit includes an input buffer 103 for receiving an external clock 106, a dummy delay circuit 105 receiving an output of the input buffer 103, a delay circuit array 101 receiving an output of the dummy delay circuit 105 and for measuring a time difference, another delay circuit array 102 connected to the delay circuit array 101 and for reproducing a delay time corresponding to the measured time difference, and a clock driver 104 receiving an output of the delay circuit array 102 and for outputting an internal clock 107.

The shown synchronous delay circuit also includes a control circuit 109 receiving an output of the input buffer 103 and for outputting a control clock CLK and an inverted control clock CLKB to the delay circuit arrays 101 and 102. For example, the control clock CLK assumes a low level from the moment a leading edge of a first one of a pair of continuous clock pulses of the external clock 106 is outputted from the input buffer 103 to the moment a leading edge of a second one of the same pair of continuous clock pulses of the external clock 106 is outputted from the input buffer 103, and also assumes a high level from the moment the leading edge of the second one of the same pair of continuous clock pulses of the external clock 106 is outputted from the input buffer 103 to the moment a leading edge of a first one of a next pair of continuous clock pulses is outputted from the input buffer 103. The inverted control clock CLKB has a phase opposite to that of the control clock CLK.

The dummy delay circuit 105 has a delay time corresponding to a sum of a delay time "td1" of the input buffer 103 and a delay time "td2" of the clock driver 104. For this purpose, the dummy delay circuit 105 includes an input buffer dummy 105A which is constituted of completely the same circuit as the input buffer 103 and therefore which has the delay time "td1" and a clock driver dummy 105B which is constituted of completely the same circuit as the clock driver 104 and therefore which has the delay time "td2".

Figure 2:
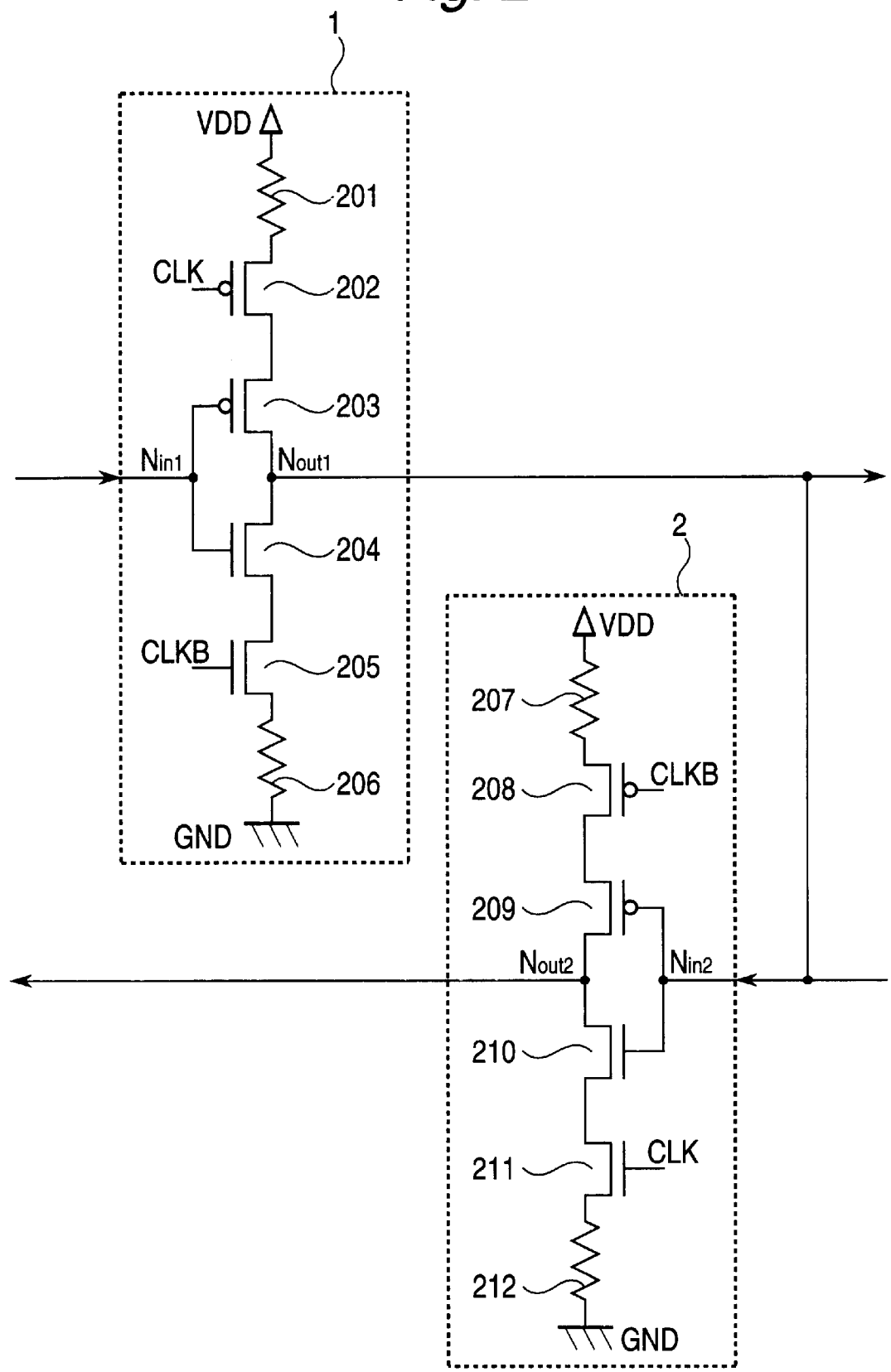
FIG. 2 is a circuit diagram illustrating one portion of delay circuit arrays in a first embodiment of the synchronous delay circuit in accordance with the present invention.

The delay circuit array 101 and the delay circuit array 102 are located in parallel to each other but to have a signal propagating direction opposite to each other in a synchronous delay circuit macro 108. The delay circuit array 101 is constituted of a plurality of cascade-connected unitary delay circuits 1 each of which is formed as shown in FIG. 2, and the delay circuit array 102 is constituted of a plurality of cascade-connected unitary delay circuits 2 each of which is formed as shown in FIG. 2. Furthermore, as shown in FIG. 2, an output of each of the unitary delay circuits in the delay circuit array 101 is connected to an input of a corresponding one of the unitary delay circuits in the delay circuit array 102, so that during a period of time for measuring a time difference of a signal, the signal is caused to advance in the delay circuit array 101, and the same signal is caused to propagate in the delay circuit array 102 in an opposite direction through the unitary delay circuits of the same number as that of the unitary delay circuits through which the signal advanced in the delay circuit array 101.

As seen from FIG. 2, the unitary delay circuits 2 in the delay circuit array 102 are cascade-connected to have the signal propagating direction opposite to that in the in the delay circuit array 101. Briefly, each of the unitary delay circuits 1 and 2 is constituted of a clocked inverter having a resistor inserted in series in an output node charging current path from a high voltage power supply line and another resistor inserted in series in an output node discharging current path to ground.

Specifically, in the shown first embodiment, each unitary delay circuit 1 includes a P-channel MOS transistor 203 having a gate connected to an input node Nin1 and a drain connected to an output node Nout1, an N-channel MOS transistor 204 having a gate connected to the input node Nin1 and a drain connected to the output node Nout1, a switching P-channel MOS transistor 202 having a gate receiving the control clock CLK and a drain connected to a source of the P-channel MOS transistor 203, a resistor 201 connected between a source of the P-channel MOS transistor 202 and a high voltage power supply line VDD, a switching N-channel MOS transistor 205 having a gate receiving the inverted control clock CLKB having the phase opposite to that of the control clock CLK and a drain connected to a source of the N-channel MOS transistor 204, and a resistor 206 connected between a source of the N-channel MOS transistor 205 and ground.

On the other hand, each unitary delay circuit 2 includes a P-channel MOS transistor 209 having a gate connected to an input node Nin2 and a drain connected to an output node Nout2, an N-channel MOS transistor 210 having a gate connected to the input node Nin2 and a drain connected to the output node Nout2, a switching P-channel MOS transistor 208 having a gate receiving the inverted control clock CLKB and a drain connected to a source of the P-channel MOS transistor 209, a resistor 207 connected between a source of the P-channel MOS transistor 208 and the high voltage power supply line VDD, a switching N-channel MOS transistor 211 having a gate receiving the control clock CLK and a drain connected to a source of the N-channel MOS transistor 210, and a resistor 212 connected between a source of the N-channel MOS transistor 211 and the ground.

As seen from the above description, in each unitary delay circuit 1, the CMOS inverter is constituted of the P-channel MOS transistor 203 and the N-channel MOS transistor 204, and the clocked inverter including the CMOS inverter is constituted of the P-channel MOS transistors 202 and 203 and the N-channel MOS transistors 204 and 205, and in each unitary delay circuit 2, the CMOS inverter is constituted of the P-channel MOS transistor 209 and the N-channel MOS transistor 210, and the clocked inverter including the CMOS inverter is constituted of the P-channel MOS transistors 208 and 209 and the N-channel MOS transistors 210 and 211.

The input node Nin1 of each unitary delay circuit 1 is connected to an output of a just preceding unitary delay circuit (not shown in FIG. 2) in the signal propagating direction in the delay circuit array 101, and the output node Nout1 of each unitary delay circuit 1 is connected to an input of a just succeeding unitary delay circuit (not shown in FIG. 2) in the signal propagating direction in the delay circuit array 101, and is also connected to the input node Nin2 of a corresponding unitary delay circuit 2 of the delay circuit array 102 which is positioned at the same position as that unitary delay circuit in the delay circuit array 101, counted from an input end of the delay circuit array 101 and an output end of the delay circuit array 102. The input node Nin2 of each unitary delay circuit 2 is connected to an output of a just preceding unitary delay circuit (not shown in FIG. 2) in the signal propagating direction in the delay circuit array 102, and the output node Nout2 of the unitary delay circuit 2 is connected to an input of a just succeeding unitary delay circuit (not shown in FIG. 2) in the signal propagating direction in the delay circuit array 102.

In the above mentioned arrangement, the control clock CLK is supplied as a control signal to the P-channel MOS transistor 202 and the N-channel MOS transistor 211, and the inverted control clock CLKB is supplied as a control signal to the N-channel MOS transistor 205 and the P-channel MOS transistor 208, in order to control the propagation of the signal in the delay circuit arrays 101 and 102. Therefore, when the control clock CLK is at the low level, and therefore, when the inverted control clock CLKB is at the high level, the signal advances in the delay circuit array 101 in a left-to-right direction in FIGS. 1 and 2, but the signal does not advance in the delay circuit array 102. On the other hand, when the control clock CLK is at the high level, and therefore, when the inverted control clock CLKB is at the low level, the signal does not advance in the delay circuit array 101, but the signal does not advance in the delay circuit array 102 in a right-to-left direction in FIGS. 1 and 2.

Now, an operation of the first embodiment of the synchronous delay circuit in accordance with the present invention will be described.

In order to remove a clock skew, this synchronous delay circuit utilizes the nature that the clock pulse is inputted at every time period tCK. Namely, it is so constructed that the delay time of {tCK−(td1+td2)} is created and inserted between the input buffer 103 having the delay time of "td1" and the clock driver 104 having the delay time of "td2" (assuming that the dummy delay circuit 105 shown in FIG. 1 is omitted in this case), so that the total delay time becomes equal to the clock period tCK [=td1+{tCK−(td1+td2)}+td2]. As a result, the internal clock 107 outputted from the clock driver 104 has the same timing as that of the external clock 106.

Figure 3:
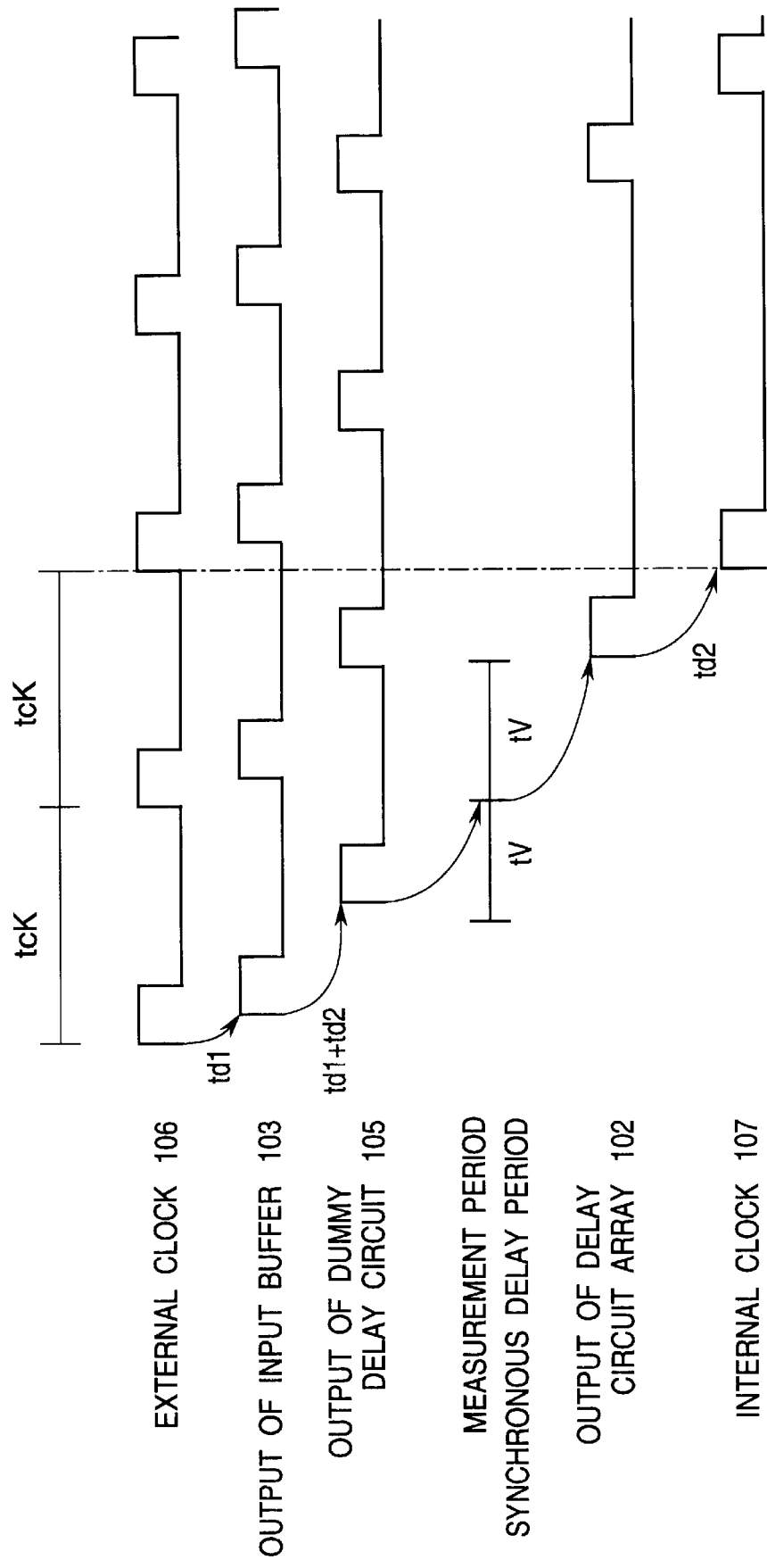
FIG. 3 is a timing chart illustrating an operation of the synchronous delay circuit shown in FIG. 1.

Referring to FIG. 3, there is shown a timing chart illustrating an actual operation timing of the first embodiment of the synchronous delay circuit. The operation of the synchronous delay circuit needs two time periods, namely, 2tCK. In a first period, a delay time {tCK−(td1+td2)} depending upon the period of the clock is measured, and a delay length of the delay circuit array for reproducing the measured delay time {tCK−(td1+td2)} is determined. In a second period, the signal is further delayed by the determined delay time {tCK−(td1+td2)}.

First, in order to measure the delay time {tCK−(td1+td2)} depending upon the period of the clock in the first one period, the dummy delay circuit 105 and the delay circuit array 101 are used.

For this purpose, the control circuit 109 outputs the control clock CLK of the low level and the inverted control clock CLKB of the high level during one clock period tCK from the moment a leading edge of a first clock pulse of a first pair of continuous clock pulses of the external clock 106 is outputted from the input buffer 103 to the moment a leading edge of a second clock pulse of the first pair of continuous clock pulses of the external clock 106 is outputted from the input buffer 103. In this first one period, the external clock 106 is caused to advance through the dummy delay circuit 105 and the delay circuit array 101.

Since the dummy delay circuit 105 has the delay time of (td1+td2), the advancing time of the first clock pulse inputted into the delay circuit array 101 becomes {tCK−(td1+td2)}, and the delay time of the delay circuit array 102 is set to be equal to the time {tCK−(td1+td2)} in which the leading edge of the signal has advanced in the delay circuit array 101. At this time, the leading edge of the signal has advanced in the delay circuit array 101 is transferred to the input of a corresponding unitary delay circuit in the delay circuit array 102.

Thus, in the second period, the control circuit 109 outputs the control clock CLK of the high level and the inverted control clock CLKB of the low level during one clock period tCK from the moment the leading edge of the second clock pulse of the first pair of continuous clock pulses of the external clock 106 is outputted from the input buffer 103 to the moment a leading edge of a first clock pulse of a second pair of continuous clock pulses of the external clock 106 is outputted from the input buffer 103. As a result, the external clock applied to the delay circuit array 101 can no longer advance in the delay circuit array 101, and on the other hand, the external clock transferred to the delay circuit array 102 propagates through the delay circuit array 102 having the delay amount of {tCK−(td1+td2)}, in the opposite direction, and further passes through the clock driver 104, so that the internal clock 107 is outputted from the clock driver 104.

Namely, during a period from the moment the first clock pulse is outputted from the input buffer 103 to the moment the second clock pulse is outputted from the input buffer 103, the first clock pulse applied into the delay circuit array 101 has advanced in the delay circuit array 101 to a position corresponding to the time of {tCK−(td1+td2)}. At this position, the first clock pulse is transferred from the delay circuit array 101 to the delay circuit array 102. Therefore, when the first clock pulse has advanced in the delay circuit array 102 in the signal propagating direction opposite to that of the delay circuit array 101 by the time of {tCK−(td1+td2)} in which the first clock pulse had advanced in the delay circuit array 101, the first clock pulse is outputted from the delay circuit array 102.

In the above mentioned process, the internal clock 107 having no clock skew can be obtained with two clock periods 2tCK. However, as shown in FIG. 3, the clock pulses of the external clock 106 are outputted every other as the internal clock 107. Namely, one of each two continuous clock pulses of the external clock 106 is thinned out. Therefore, in order to generate the internal clock having the same pulse repetition frequency as that of the external clock 107, in synchronism with the external clock 107, it is necessary to provide two pairs of delay circuit arrays 101 and 102. In this case, for example, one pair of delay circuit arrays 101 and 102 are driven by the control clock CLK having a phase opposite to that of the control clock CLK applied to the other pair of delay circuit arrays 101 and 102, and respective outputs of the two delay circuit arrays 102 are combined by means of an OR gate.

As shown in FIG. 2, since the control clock CLK is supplied to the P-channel MOS transistor 202 and the N-channel MOS transistor 211, and the control clock CLKB is supplied to the N-channel MOS transistor 205 and the P-channel MOS transistor 208, when the control clock CLK is at the low level "L" and the control clock CLKB is at the high level "H", the leading edge of the external clock advances in the delay circuit array 101, and when the control clock CLK is at the high level "H" and the control clock CLKB is at the low level "L", the leading edge of the external clock advances in the delay circuit array 102 in the opposite direction.

The measurement time in the delay circuit array 101 included in the synchronous delay circuit corresponds to the advancing time of the leading edge, and the reproduced time in the delay circuit array 102 corresponds to the advancing time of the leading edge in the opposite direction. This will be described with reference to FIG. 4 which illustrates an operation of a pair of delay circuit arrays having opposite signal propagating directions in the synchronous delay circuit, and FIG. 5 which is a signal waveform diagram for illustrating an operation of the pair of delay circuit arrays having opposite signal propagating directions.

Figure 4:
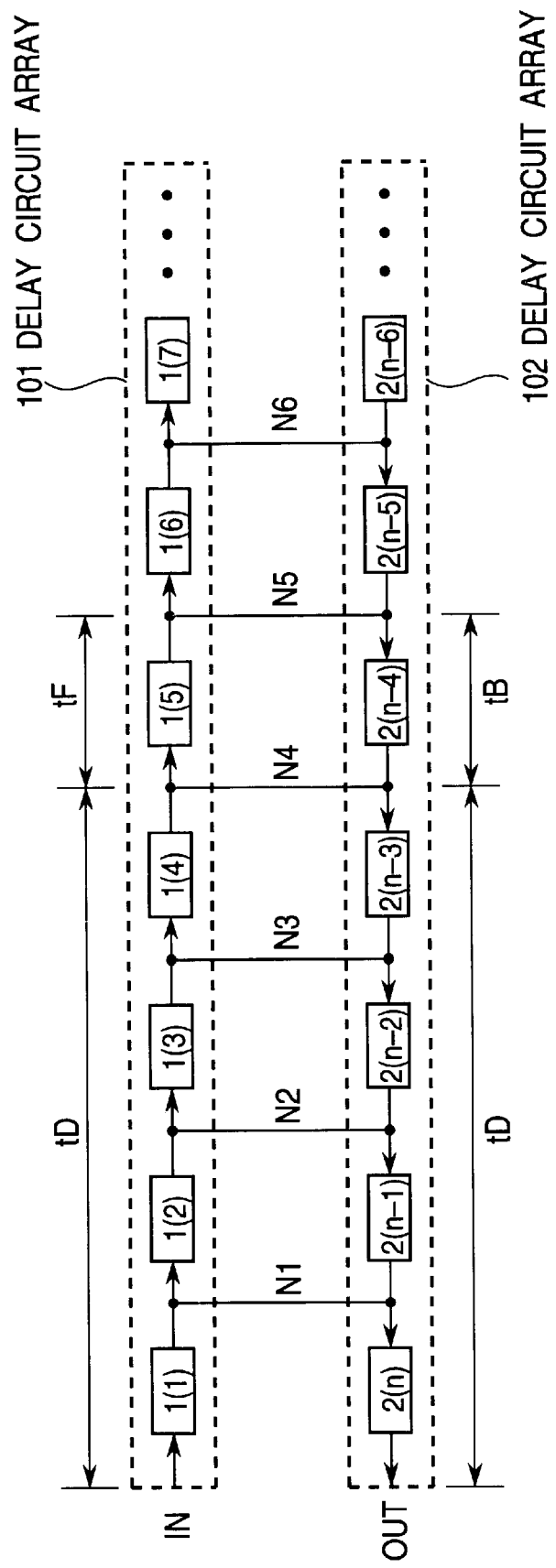
FIG. 4 illustrates an operation of a pair of delay circuit arrays in the synchronous delay circuit.

FIG. 4 diagrammatically illustrates the delay circuit arrays 101 and 102 having the signal propagating direction opposite to each other. Each small block is indicative of one unitary delay circuit which is used in each of the delay circuit arrays 101 and 102. Here, assume that each of the delay circuit arrays 101 and 102 includes "n" unitary delay circuits, and parenthesized numbers (1) to (n) are given to the "n" unitary delay circuits in the order of the signal propagating direction in each of the delay circuit arrays 101 and 102. In the delay circuit array 101, an input of a first unitary delay circuit 1(1) is connected to an input IN of the delay circuit array 101. An output of the first unitary delay circuit 1(1) is connected at a node N1 to an input of a second unitary delay circuit 1(2) and an input of a final unitary delay circuit 2(n) of the delay circuit array 102. An output of the second unitary delay circuit 1(2) is connected at a node N2 to an input of a third unitary delay circuit 1(3) and an input of a penultimate unitary delay circuit 2(n−1) of the delay circuit array 102. Similarly, an output of the third unitary delay circuit 1(3) is connected at a node N3 to an input of a fourth unitary delay circuit 1(4) and an input of a (n−2)th unitary delay circuit 2(n−2) of the delay circuit array 102, and an output of the fourth unitary delay circuit 1(4) is connected at a node N4 to an input of a fifth unitary delay circuit 1(5) and an input of a (n−3)th unitary delay circuit 2(n−3) of the delay circuit array 102. An output of the fifth unitary delay circuit 1(5) is connected at a node N5 to an input of a sixth unitary delay circuit 1(6) and an input of a (n−4)th unitary delay circuit 2(n−4) of the delay circuit array 102, and an output of the sixth unitary delay circuit 1(6) is connected at a node N6 to an input of a seventh unitary delay circuit 1(7) and an input of a (n−5)th unitary delay circuit 2(n−5) of the delay circuit array 102, and so on.

In the delay circuit array 102, on the other hand, an output of the final unitary delay circuit 2(n) is connected to an output OUT of the delay circuit array 102. The input of the final unitary delay circuit 2(n) is connected to an output of the penultimate unitary delay circuit 2(n−1), and the input of the penultimate unitary delay circuit 2(n−1) is connected to an output of the (n−2)th unitary delay circuit 2(n−2). The input of the (n−2)th unitary delay circuit 2(n−2) is connected to an output of the (n−3)th unitary delay circuit 2(n−3). The input of the (n−3)th unitary delay circuit 2(n−3) is connected to an output of the (n−4)th unitary delay circuit 2(n−4).

The input of the (n−4)th unitary delay circuit 2(n−4) is connected to an output of the (n−5)th unitary delay circuit 2(n−5). The input of the (n−5)th unitary delay circuit 2(n−5) is connected to an output of the (n−6)th unitary delay circuit 2(n−6), and so on.

Figure 5:
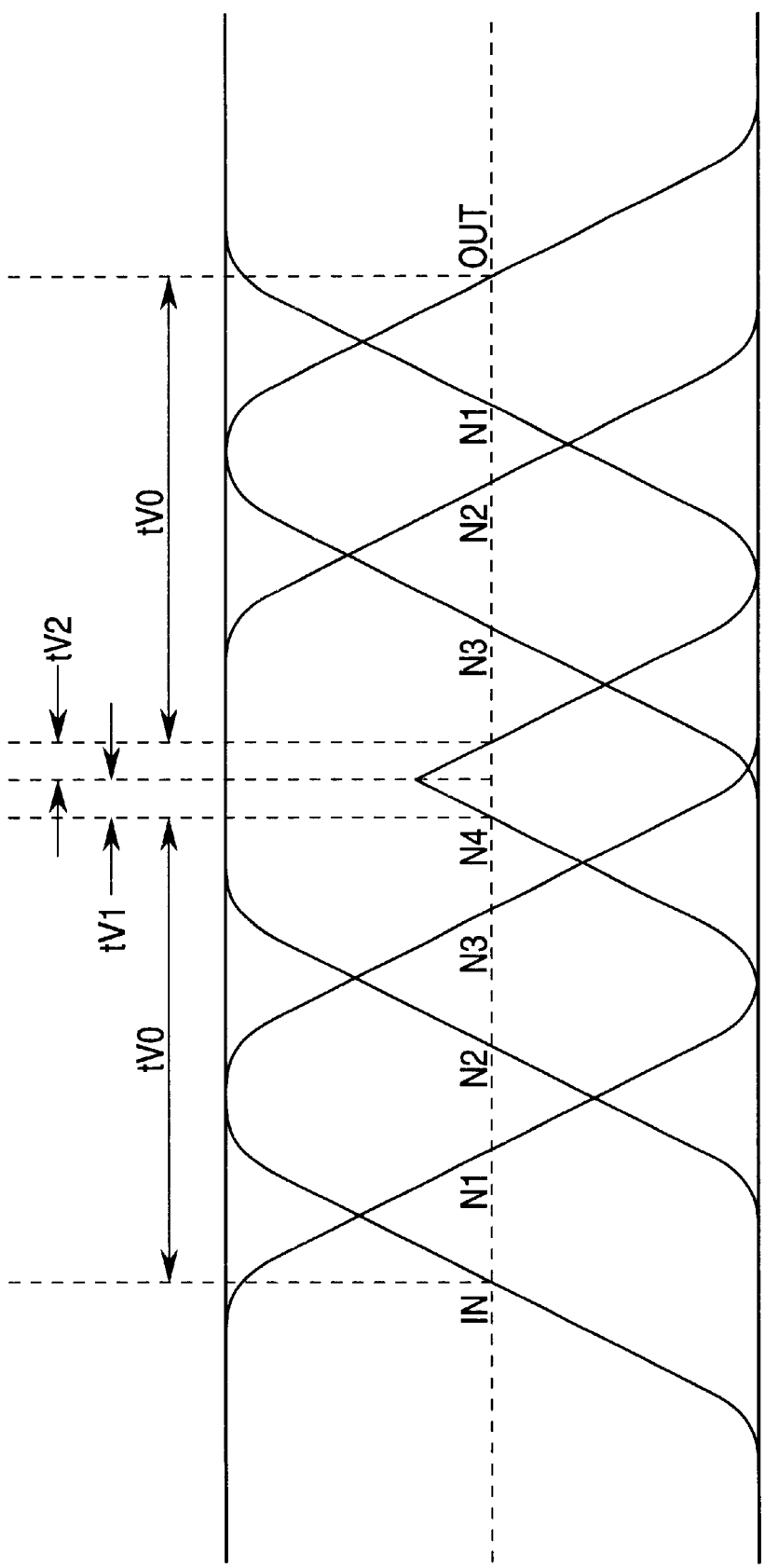
FIG. 5 is a signal waveform diagram for illustrating an operation of the pair of delay circuit arrays in the synchronous delay circuit.

FIG. 5 illustrates waveforms on various nodes when the clock pulse leading edge has advanced to the node N5 in the delay circuit array 101 in FIG. 4 and then advanced from the node N5 in the delay circuit array 102 in the opposite direction. For simplification, a waveform on the node N5 is omitted. The delay time tD shown in FIG. 4 corresponds to tV0 in FIG. 5. The delay time tF shown in FIG. 4 corresponds to tV1 in FIG. 5, and the delay time tB shown in FIG. 4 corresponds to tV2 in FIG. 5.

Figure 6:
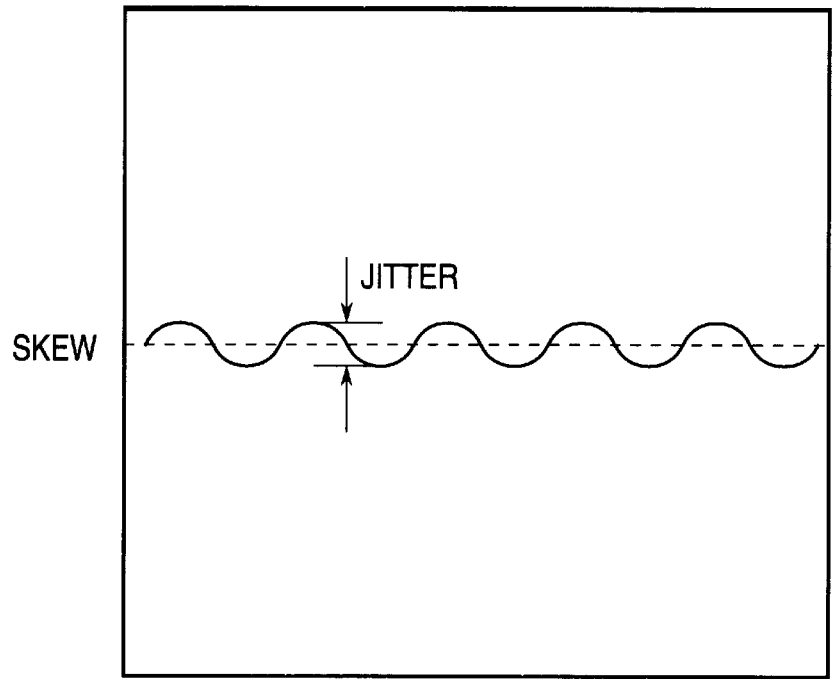
FIG. 6 illustrates the jitter in the synchronous delay circuit.

In FIG. 5, {tV0+tV1} corresponds to the measurement time, and {tV0+tV2} corresponds to the reproduction time. If tV1 and tV2 are different, a difference between tV1 and tV2 becomes an error, with the result that as shown in FIG. 6, some amplitude occurs (called a "jitter" in this specification) which varies periodically.

In the delay circuit array, each node is charged through the P-channel MOS transistor and is discharged through the N-channel transistor. Therefore, this jitter depends upon the difference between the charging time through the P-channel MOS transistor and the discharging time through the N-channel transistor. On the other hand, as mentioned hereinbefore, in order to reduce the number of unitary delay circuit stages in the delay circuit array for the purpose of decreasing the area of the delay circuit array, it is necessary to increase the delay time per one unitary delay circuit stage in the delay circuit array.

Figure 14:
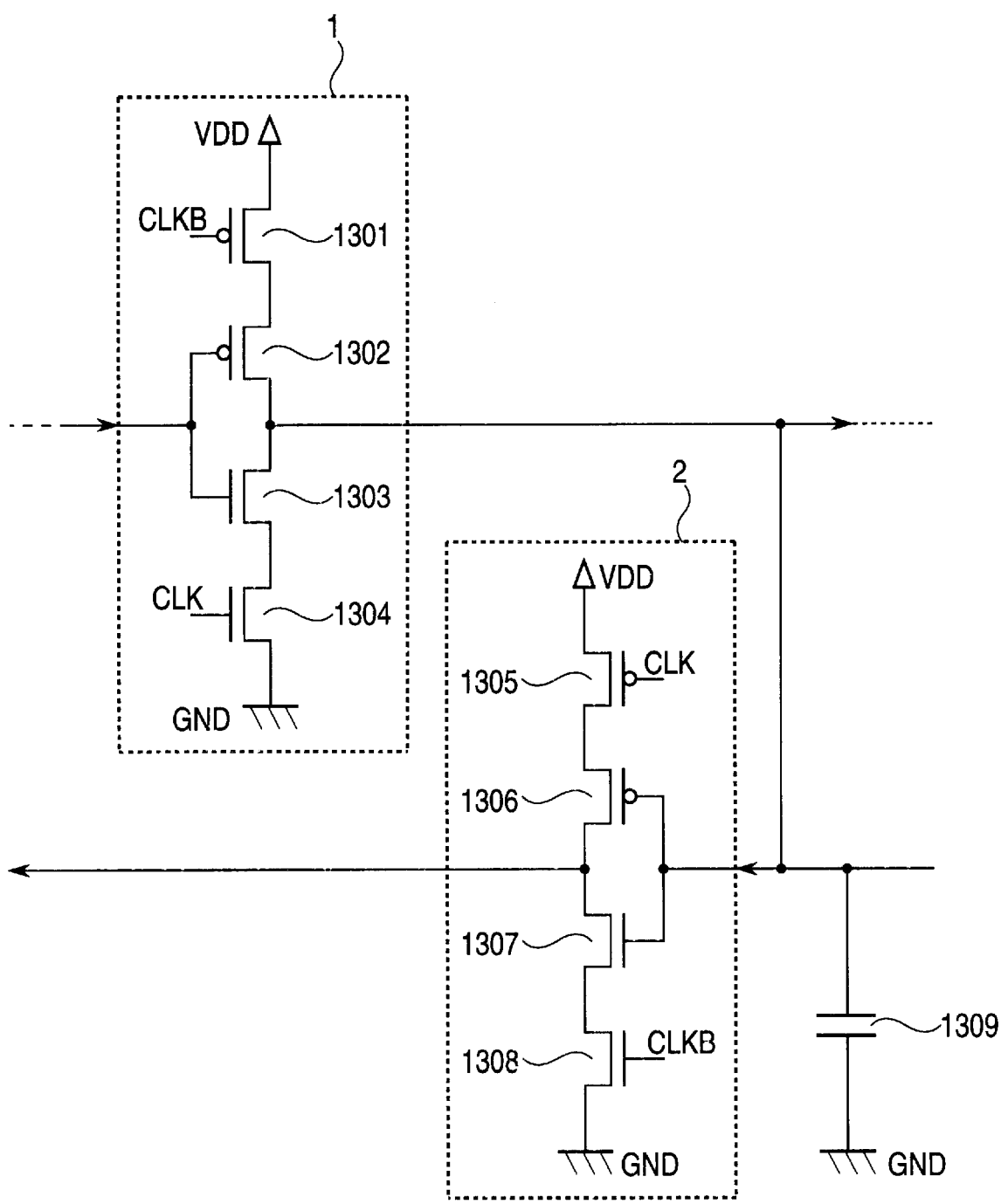
FIG. 14 is a circuit diagram illustrating one portion of delay circuit arrays in the prior art synchronous delay circuit.

Here, examination will be made on the prior art construction already explained with reference to FIG. 14, in which the capacitor 1309 is added to the node of the unitary delay circuit in order to increase the delay time per one unitary delay circuit. In addition, assume in FIG. 14 that an ON resistance of the P-channel MOS transistor is Rp, an ON resistance of the N-channel MOS transistor is Rn, a total capacitance to be driven is C, and a constant number is "a". Under this condition, the charging time through the P-channel MOS transistors can be approximated to {a×2Rp×C}, and the discharging time through the N-channel transistors can be approximated to {a×2Rn×C}.

Figure 7:
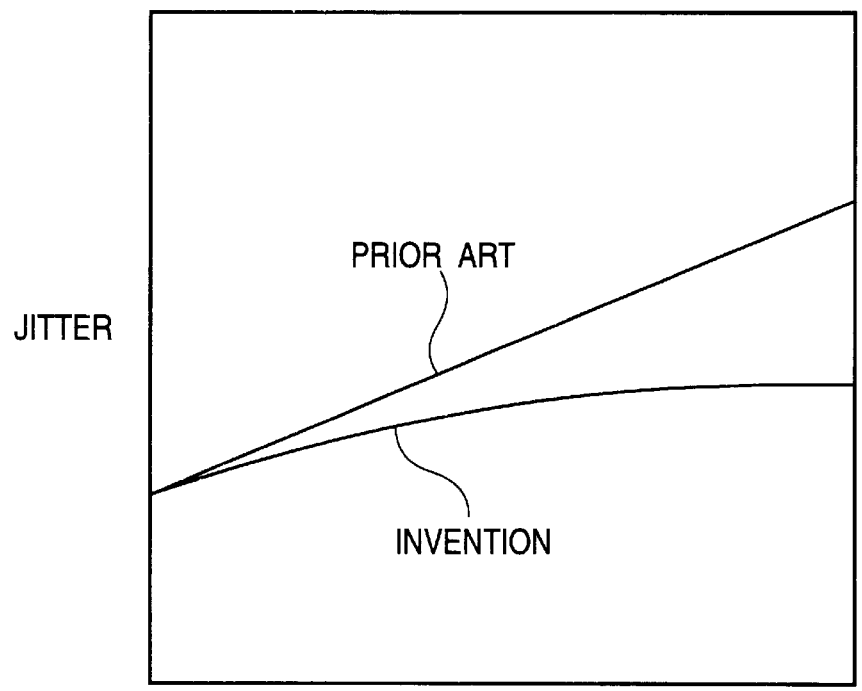
FIG. 7 illustrates the jitter in one embodiment of the synchronous delay circuit in accordance with the present invention and the jitter in a prior art synchronous delay circuit as a comparison example.

Therefore, the difference between the charging time through the P-channel MOS transistors and the discharging time through the N-channel transistors is expressed by {2a×(Rp−Rn)×C}. Therefore, the jitter increases with increase in the capacitance added. Accordingly, as shown in FIG. 7, the jitter increases with increase in the delay time per one unitary delay circuit.

On the other hand, in the delay circuit shown in FIG. 2, assuming that a resistance of the resistors 201, 206, 207 and 212 (each of which acts as an independent current limiting means) is "R", the charging time through the P-channel MOS transistors can be approximated to {a×(2Rp+R)×C}, and the discharging time through the N-channel transistors can be approximated to {a×(2Rn+R)×C}. Accordingly, the difference between the charging time through the P-channel MOS transistors and the discharging time through the N-channel transistors is expressed by {2a×(Rp−Rn)×C}.

Therefore, by increasing the resistance "R", it is possible to increase the delay time per one unitary delay circuit. However, since the total capacitance "C" to be driven does not substantially increase, the difference between the charging time through the P-channel MOS transistors and the discharging time through the N-channel transistors does not become large, with the result that the jitter is suppressed as shown in FIG. 7.

In this connection, it may be considered to increase the ON resistance itself of the MOS transistors constituting the clocked inverter, in order to increase the charging time and the discharging time. This approach can be realized for example by increasing a gate length of the MOS transistor. However, this approach will result in an increased jitter, similarly to the case of adding the capacitor to the output node of the clocked inverter. The reason is as follows: As well known to persons skilled in the art, a threshold of a transistor is inevitably different from one device to another and from one chip to another because of variation in a semiconductor device fabricating process. Therefore, it is substantially impossible to make the difference between the ON resistance of the N-channel MOS transistor and the ON resistance of the P-channel MOS transistor (Rp−Rn) perfectly zero. As a result, when the ON resistance of the transistors is increased, the difference between the ON resistance of the P-channel MOS transistor and the ON resistance of the N-channel MOS transistor (Rp−Rn) will correspondingly increase, and therefore, the jitter becomes large. Here, if the increasing ratio of the ON resistance is expressed by a current drive capability amplification factor "α", the difference Δt between the charging time through the P-channel MOS transistors and the discharging time through the N-channel transistors in the clocked inverter shown in FIG. 14 is expressed as $$\Delta t = \{a \times 2\alpha Rp \times C\} - \{a \times 2\alpha Rn \times C\}$$
$$= 2a \times \alpha (Rp - Rn) \times C$$

Therefore, if the ON resistance is increased, the difference Δt between the charging time through the P-channel MOS transistors and the discharging time through the N-channel transistor will correspondingly increase.

Figure 8:
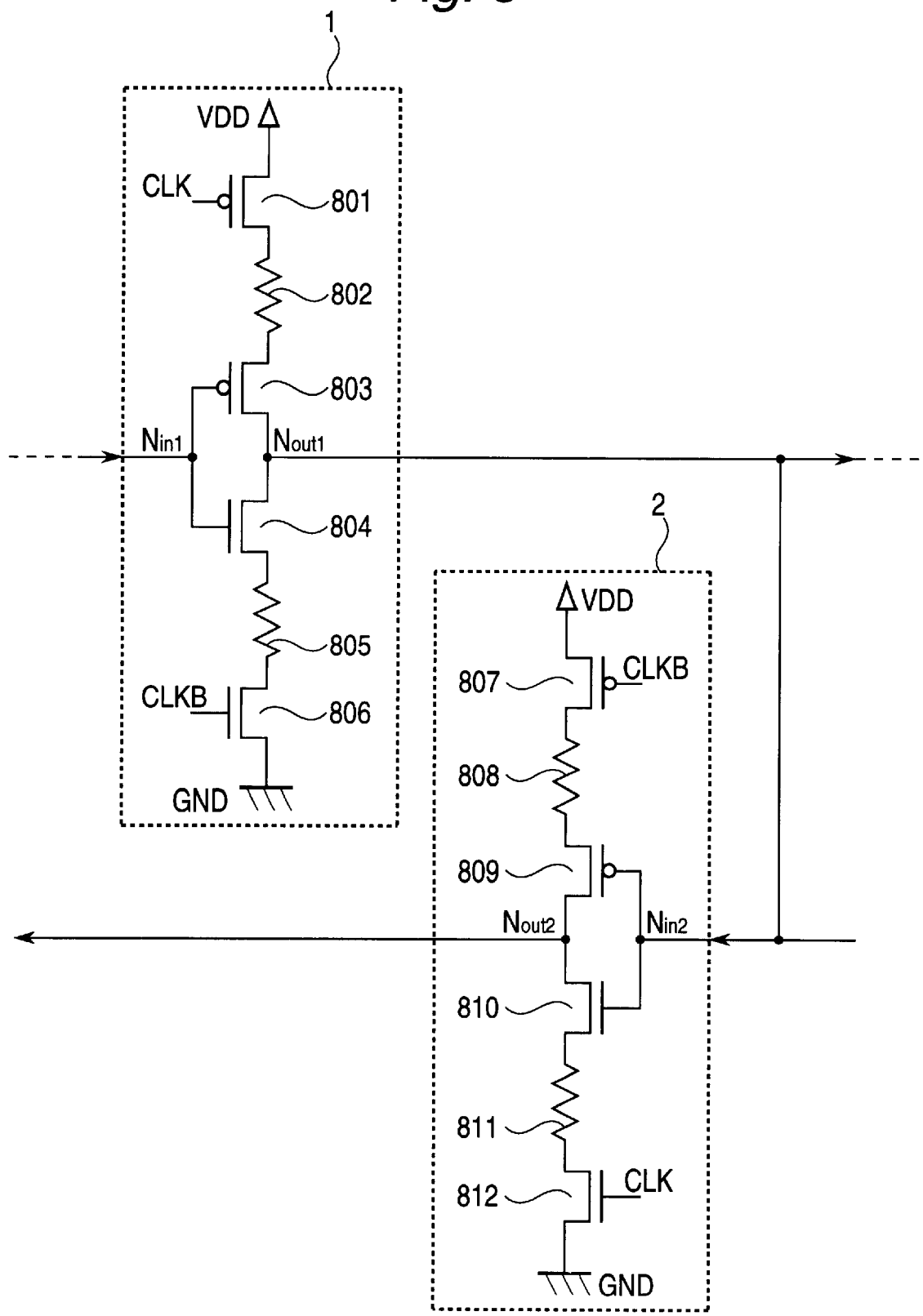
FIG. 8 is a circuit diagram illustrating one portion of delay circuit arrays in a second embodiment of the synchronous delay circuit in accordance with the present invention.

Referring to FIG. 8, there is shown a circuit diagram similar to FIG. 2 but illustrating one portion of delay circuit arrays in a second embodiment of the synchronous delay circuit in accordance with the present invention.

In this second embodiment, each of the unitary delay circuits 1 in the delay circuit array 101 includes a switching P-channel MOS transistor 801 having a gate receiving the control clock CLK and a source connected to a high voltage power supply line VDD, a resistor 802 having one end connected to a drain of the P-channel MOS transistor 801, a P-channel MOS transistor 803 having a source connected to the other end of the resistor 802, a gate connected to an input node Nin1 and a drain connected to an output node Nout1, an N-channel MOS transistor 804 having a gate connected to the input node Nin1 and a drain connected to the output node Nout1, a resistor 805 having one end connected to a source of the N-channel MOS transistor 804, and a switching N-channel MOS transistor 806 having a gate receiving the inverted control clock CLKB having the phase opposite to that of the control clock CLK, a drain connected to the other end of the resistor 805 and a source connected to ground.

On the other hand, each of the unitary delay circuits 2 in the delay circuit array 102 includes a switching P-channel MOS transistor 807 having a gate receiving the inverted control clock CLKB and a source connected to the high voltage power supply line VDD, a resistor 808 having one end connected of a drain of the P-channel MOS transistor 807, a P-channel MOS transistor 809 having a gate connected to an input node Nin2, a source connected to the other end of the resistor 808 and a drain connected to an output node Nout2, an N-channel MOS transistor 810 having a gate connected to the input node Nin2 and a drain connected to the output node Nout2, a resistor 811 having one end connected to a source of the N-channel MOS transistor 810, and a switching N-channel MOS transistor 812 having a gate receiving the control clock CLK, a drain connected to the other end of the resistor 811 and a source connected to the ground.

As seen from comparison between FIG. 2 and FIG. 8, the second embodiment is different from the first embodiment only in the resistor insertion positions. Therefore, in each unitary delay circuit 1, the CMOS inverter is constituted of the P-channel MOS transistor 803 and the N-channel MOS transistor 804, and the clocked inverter including the CMOS inverter is constituted of the P-channel MOS transistors 801 and 803 and the N-channel MOS transistors 804 and 806, and in each unitary delay circuit 2, the CMOS inverter is constituted of the P-channel MOS transistor 809 and the N-channel MOS transistor 810, and the clocked inverter including the CMOS inverter is constituted of the P-channel MOS transistors 807 and 809 and the N-channel MOS transistors 810 and 812.

As the independent current limiting means, the resistor 802 is inserted between the P-channel MOS transistor 803 of the CMOS inverter and the switching P-channel MOS transistor 801, and the resistor 805 is inserted between the N-channel MOS transistor 804 of the CMOS inverter and the switching N-channel MOS transistor 806. Similarly, the resistor 808 is inserted between the P-channel MOS transistor 809 of the CMOS inverter and the switching P-channel MOS transistor 807, and the resistor 811 is inserted between the N-channel MOS transistor 810 of the CMOS inverter and the switching N-channel MOS transistor 812.

Therefore, in this second embodiment, by adding the resistors, it is possible to increase the delay time per one unitary delay circuit while suppressing the increase in the difference between the charging time and the discharging time. Accordingly, an advantage similar to that obtained in the first embodiment can be obtained in the second embodiment.

Figure 9:
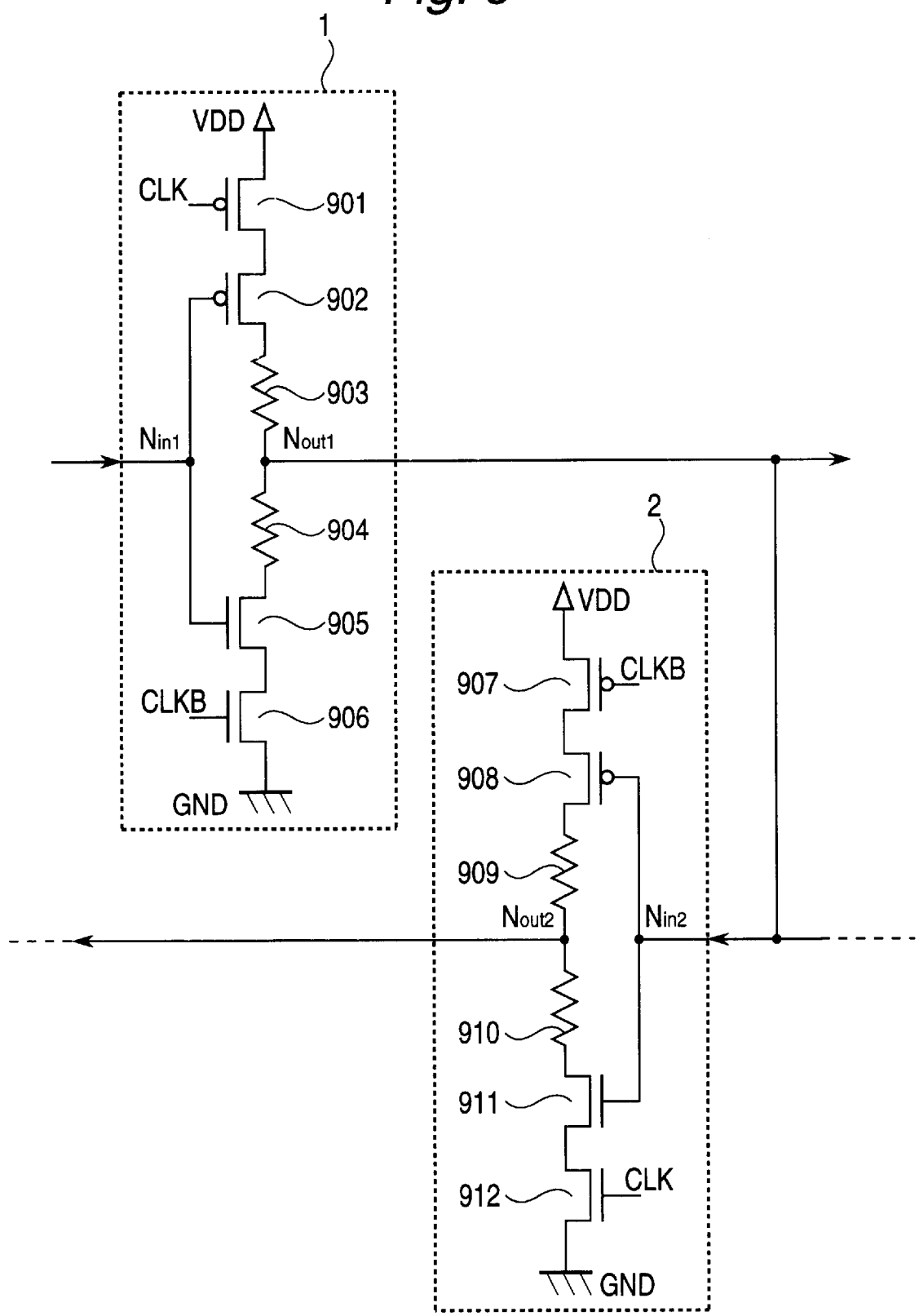
FIG. 9 is a circuit diagram illustrating one portion of delay circuit arrays in a third embodiment of the synchronous delay circuit in accordance with the present invention.

Referring to FIG. 9, there is shown a circuit diagram similar to FIG. 2 but illustrating one portion of delay circuit arrays in a third embodiment of the synchronous delay circuit in accordance with the present invention.

In this third embodiment, each of the unitary delay circuits 1 in the delay circuit array 101 includes a switching P-channel MOS transistor 901 having a gate receiving the control clock CLK and a source connected to a high voltage power supply line VDD, a P-channel MOS transistor 902 having a gate connected to an input node Nin1 and a source connected to a drain of the P-channel MOS transistor 901, a resistor 903 connected between a source of the P-channel MOS transistor 902 and an output node Nout1, a resistor 904 having one end connected to the output node Nout1, an N-channel MOS transistor 905 having a gate connected to the input node Nin1 and a drain connected to the other end of the resistor 904, and a switching N-channel MOS transistor 906 having a gate receiving the inverted control clock CLKB having the phase opposite to that of the control clock CLK, a drain connected to a source of the N-channel MOS transistor 905 and a source connected to the ground.

On the other hand, each of the unitary delay circuits 2 in the delay circuit array 102 includes a switching P-channel MOS transistor 907 having a gate receiving the inverted control clock CLKB and a source connected to the high voltage power supply line VDD, a P-channel MOS transistor 908 having a gate connected to an input node Nin2 and a source connected to a drain of the P-channel MOS transistor 907, a resistor 909 connected between a source of the P-channel MOS transistor 908 and an output node Nout2, a resistor 910 having one end connected to the output node Nout2, an N-channel MOS transistor 911 having a gate connected to the input node Nin2 and a drain connected to the other end of the resistor 910, and a switching N-channel MOS transistor 912 having a gate receiving the control clock CLK, a drain connected to a source of the N-channel MOS transistor 911 and a source connected to the ground.

As seen from comparison between FIG. 2 and FIG. 9, the third embodiment is different from the first embodiment only in the resistor insertion positions. Therefore, in each unitary delay circuit 1, the CMOS inverter is constituted of the P-channel MOS transistor 902 and the N-channel MOS transistor 905, and the clocked inverter including the CMOS inverter is constituted of the P-channel MOS transistors 901 and 902 and the N-channel MOS transistors 905 and 906, and in each unitary delay circuit 2, the CMOS inverter is constituted of the P-channel MOS transistor 908 and the N-channel MOS transistor 911, and the clocked inverter including the CMOS inverter is constituted of the P-channel MOS transistors 907 and 908 and the N-channel MOS transistors 911 and 912.

As the independent current limiting means, the resistor 903 is inserted between the P-channel MOS transistor 902 of the CMOS inverter and the output node Nout1, and the resistor 904 is inserted between the N-channel MOS transistor 905 of the CMOS inverter and the output node Nout1. Similarly, the resistor 909 is inserted between the P-channel MOS transistor 908 of the CMOS inverter and the output node Nout2, and the resistor 910 is inserted between the N-channel MOS transistor 911 of the CMOS inverter and the output node Nout2.

Therefore, in this third embodiment, by adding the resistors, it is possible to increase the delay time per one unitary delay circuit while suppressing the increase in the difference between the charging time and the discharging time. Accordingly, an advantage similar to that obtained in the first embodiment can be obtained in the third embodiment.

Figure 10:
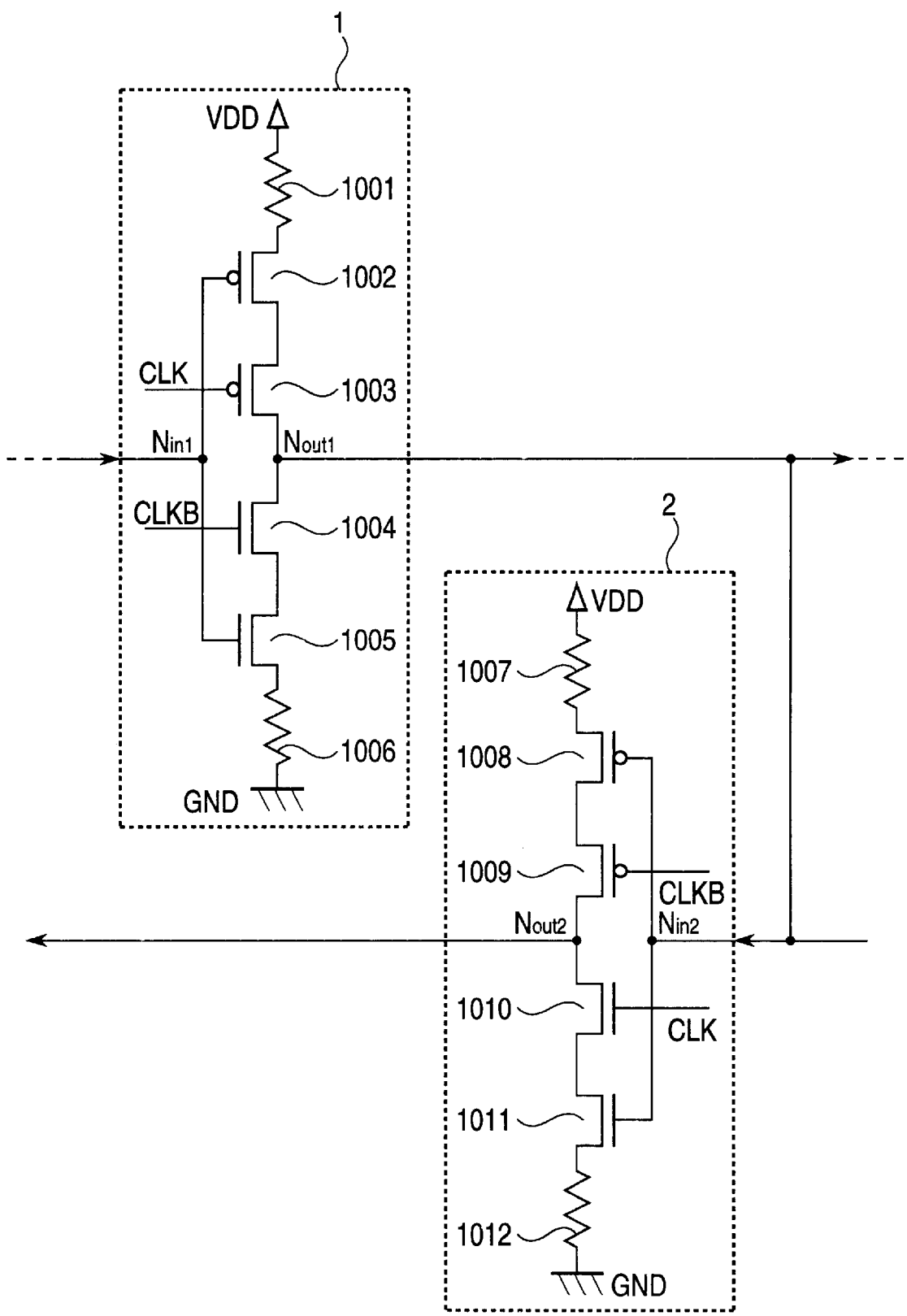
FIG. 10 is a circuit diagram illustrating one portion of delay circuit arrays in a fourth embodiment of the synchronous delay circuit in accordance with the present invention.

Referring to FIG. 10, there is shown a circuit diagram similar to FIG. 2 but illustrating one portion of delay circuit arrays in a fourth embodiment of the synchronous delay circuit in accordance with the present invention.

In this fourth embodiment, each of the unitary delay circuits 1 in the delay circuit array 101 includes a resistor 1001 having one end connected to a high voltage power supply line VDD, a P-channel MOS transistor 1002 having a source connected to the other end of the resistor 1001 and a gate connected to an input node Nin1, a switching P-channel MOS transistor 1003 having a gate receiving the control clock CLK, a source connected to a drain of the P-channel MOS transistor 1002 and a drain connected to an output node Nout1, a switching N-channel MOS transistor 1004 having a gate receiving the inverted control clock CLKB having the phase opposite to that of the control clock CLK and a drain connected to the output node Nout1, an N-channel MOS transistor 1005 having a gate connected to the input node Nin1 and a drain connected to a source of the N-channel MOS transistor 1004, and a resistor 1006 connected between a source of the N-channel MOS transistor 1005 and ground.

On the other hand, each of the unitary delay circuits 2 in the delay circuit array 102 includes a resistor 1007 having one end connected to the high voltage power supply line VDD, a P-channel MOS transistor 1008 having a source connected to the other end of the resistor 1007 and a gate connected to an input node Nin2, a switching P-channel MOS transistor 1009 having a gate receiving the inverted control clock CLKB, a source connected to a drain of the P-channel MOS transistor 1008 and a drain connected to an output node Nout2, a switching N-channel MOS transistor 1010 having a gate receiving the control clock CLK and a drain connected to the output node Nout2, an N-channel MOS transistor 1011 having a gate connected to the input node Nin2 and a drain connected to a source of the N-channel MOS transistor 1010, and a resistor 1012 connected between a source of the N-channel MOS transistor 1011 and the ground.

As seen from comparison between FIG. 2 and FIG. 10, the fourth embodiment is different from the first embodiment only in the switching transistor insertion positions. Therefore, in each unitary delay circuit 1, the CMOS inverter is constituted of the P-channel MOS transistor 1002 and the N-channel MOS transistor 1005, and the clocked inverter including the CMOS inverter is constituted of the P-channel MOS transistors 1002 and 1003 and the N-channel MOS transistors 1004 and 1005, and in each unitary delay circuit 2, the CMOS inverter is constituted of the P-channel MOS transistor 1008 and the N-channel MOS transistor 1011, and the clocked inverter including the CMOS inverter is constituted of the P-channel MOS transistors 1008 and 1009 and the N-channel MOS transistors 1010 and 1011.

As the independent current limiting means, the resistor 1001 is inserted between the P-channel MOS transistor 1002 of the CMOS inverter and the high voltage power supply line VDD, and the resistor 1006 is inserted between the N-channel MOS transistor 1005 of the CMOS inverter and the ground. Similarly, the resistor 1007 is inserted between the P-channel MOS transistor 1008 of the CMOS inverter and the high voltage power supply line VDD, and the resistor 1012 is inserted between the N-channel MOS transistor 1011 of the CMOS inverter and the ground.

Therefore, in this fourth embodiment, by adding the resistors, it is possible to increase the delay time per one unitary delay circuit while suppressing the increase in the difference between the charging time and the discharging time. Accordingly, an advantage similar to that obtained in the first embodiment can be obtained in the fourth embodiment.

Figure 11:
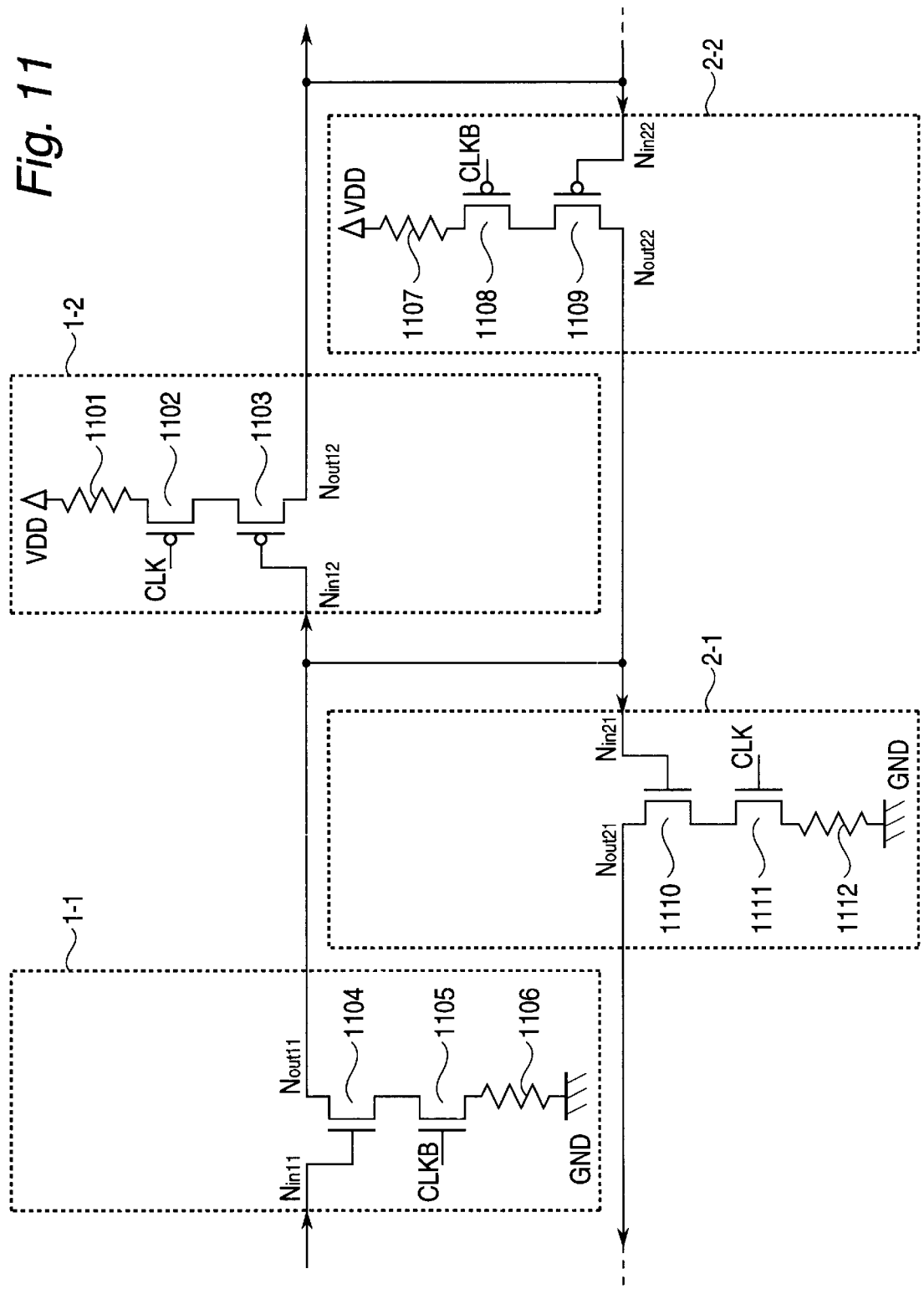
FIG. 11 is a circuit diagram illustrating one portion of delay circuit arrays in a fifth embodiment of the synchronous delay circuit in accordance with the present invention.

Referring to FIG. 11, there is shown a circuit diagram illustrating one portion of delay circuit arrays in a fifth embodiment of the synchronous delay circuit in accordance with the present invention. FIG. 11 illustrates two unitary delay circuits 1-1 and 1-2 of the delay circuit array 101 and two unitary delay circuits 2-1 and 2-2 of the delay circuit array 102.

In this fifth embodiment, each of the unitary delay circuits 1-1 and 2-1 is composed of a clocked inverter formed of N-channel MOS transistors (to include no P-channel MOS transistor), and each of the unitary delay circuits 1-2 and 2-2 is composed of a clocked inverter formed of P-channel MOS transistors (to include no N-channel MOS transistor).

Specifically, the unitary delay circuit 1-1 includes an inverter N-channel MOS transistor 1104 having a gate connected to an input node Nin11 and a drain connected to an output node Nout11, a switching N-channel transistor 1105 having a gate receiving the inverted control clock CLKB and a drain connected to a source of the N-channel MOS transistor 1104, and a resistor 1106 connected between a source of the N-channel MOS transistor 1105 and ground. The unitary delay circuit 1-2 includes a resistor 1101 having one end connected to a high voltage power supply line VDD, a switching P-channel transistor 1102 having a gate receiving the control clock CLK and a source connected to the other end of the resistor 1101, and an inverter P-channel MOS transistor 1103 having a gate connected to an input node Nin12, a drain connected to an output node Nout12 and a source connected to a drain of the switching P-channel transistor 1102.

The unitary delay circuit 2-1 includes an inverter N-channel MOS transistor 1110 having a gate connected to an input node Nin21 and a drain connected to an output node Nout21, a switching N-channel transistor 1111 having a gate receiving the control clock CLK and a drain connected to a source of the N-channel MOS transistor 1110, and a resistor 1112 connected between a source of the N-channel MOS transistor 1111 and the ground. The unitary delay circuit 2-2 includes a resistor 1107 having one end connected to the high voltage power supply line VDD, a switching P-channel transistor 1108 having a gate receiving the inverted control clock CLKB and a source connected to the other end of the resistor 1107, and an inverter P-channel MOS transistor 1109 having a gate connected to an input node Nin22, a drain connected to an output node Nout22 and a source connected to a drain of the switching P-channel transistor 1108.

Furthermore, the output node Nout11 of the unitary delay circuit 1-1 composed of the N-channel MOS transistors is connected to the input node Nin12 of the unitary delay circuit 1-2 composed of the P-channel MOS transistors in the same delay circuit array 101, and is also connected to the input node Nin21 of the unitary delay circuit 2-1 in the delay circuit array 102. The output node Nout12 of the unitary delay circuit 1-2 composed of the P-channel MOS transistors is connected to an input node of a just succeeding unitary delay circuit (not shown in FIG. 11) which is located in the same delay circuit array 101 and which is composed of the N-channel MOS transistors, and is also connected to the input node Nin22 of the unitary delay circuit 2-2 in the delay circuit array 102. Namely, each of the delay circuit arrays 101 and 102 is constituted by alternately cascade-connecting a plurality of unitary delay circuits composed of N-channel MOS transistors (as the unitary delay circuits 1-1 and 2-1) and a plurality of unitary delay circuits composed of P-channel MOS transistors (as the unitary delay circuits 1-2 and 2-2). In this construction, only either a rising edge or a falling edge is used in a signal propagation from one unitary delay circuit to a next unitary delay circuit in the delay circuit array. For example, in FIG. 11, only the falling edge is used in the signal propagation from the unitary delay circuit 1-1 to the unitary delay circuit 1-2, and on the other hand, only the rising edge is used in the signal propagation from the unitary delay circuit 2-2 to the unitary delay circuit 2-1. By adopting this arrangement, the number of circuit elements required in the delay circuit array can be reduced to a half.

Also in this fifth embodiment, by adding the resistors, it is possible to increase the delay time per one unitary delay circuit while suppressing the increase in the difference between the charging time and the discharging time. Accordingly, an advantage similar to that obtained in the first embodiment can be obtained in the fifth embodiment.

Figure 12:
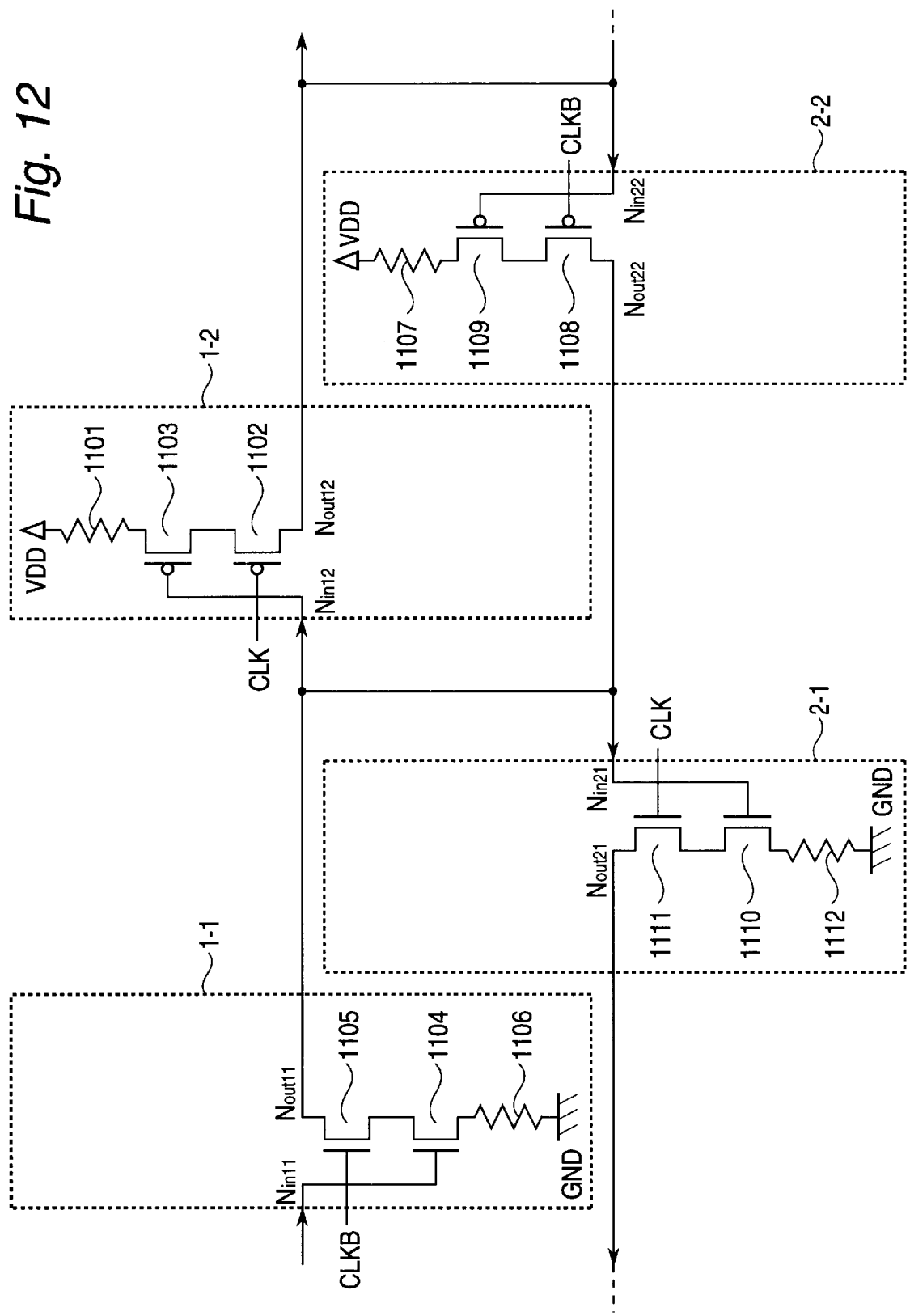
FIG. 12 is a circuit diagram illustrating one portion of delay circuit arrays in a modification of the fifth embodiment of the synchronous delay circuit in accordance with the present invention.

Referring to FIG. 12, there is shown a circuit diagram illustrating one portion of delay circuit arrays in a modification of the fifth embodiment of the synchronous delay circuit shown in FIG. 11. In FIG. 12, elements corresponding to those shown in FIG. 11 are given the same reference numbers, and explanation will be omitted for simplification of the description.

As seen from comparison between FIG. 11 and FIG. 12, the modification shown in FIG. 12 is different from the fifth embodiment of the synchronous delay circuit shown in FIG. 11 only in which the inverter transistor and its associated switching transistor in the NMOS or PMOS clocked inverter of each unitary delay circuit are exchanged in place.

Therefore, an advantage similar to that obtained in the fifth embodiment can be obtained.

In addition, this fifth embodiment can be applied when the position of each resistor is changed similarly to the embodiment shown in FIG. 8 or 9.

Figure 13:
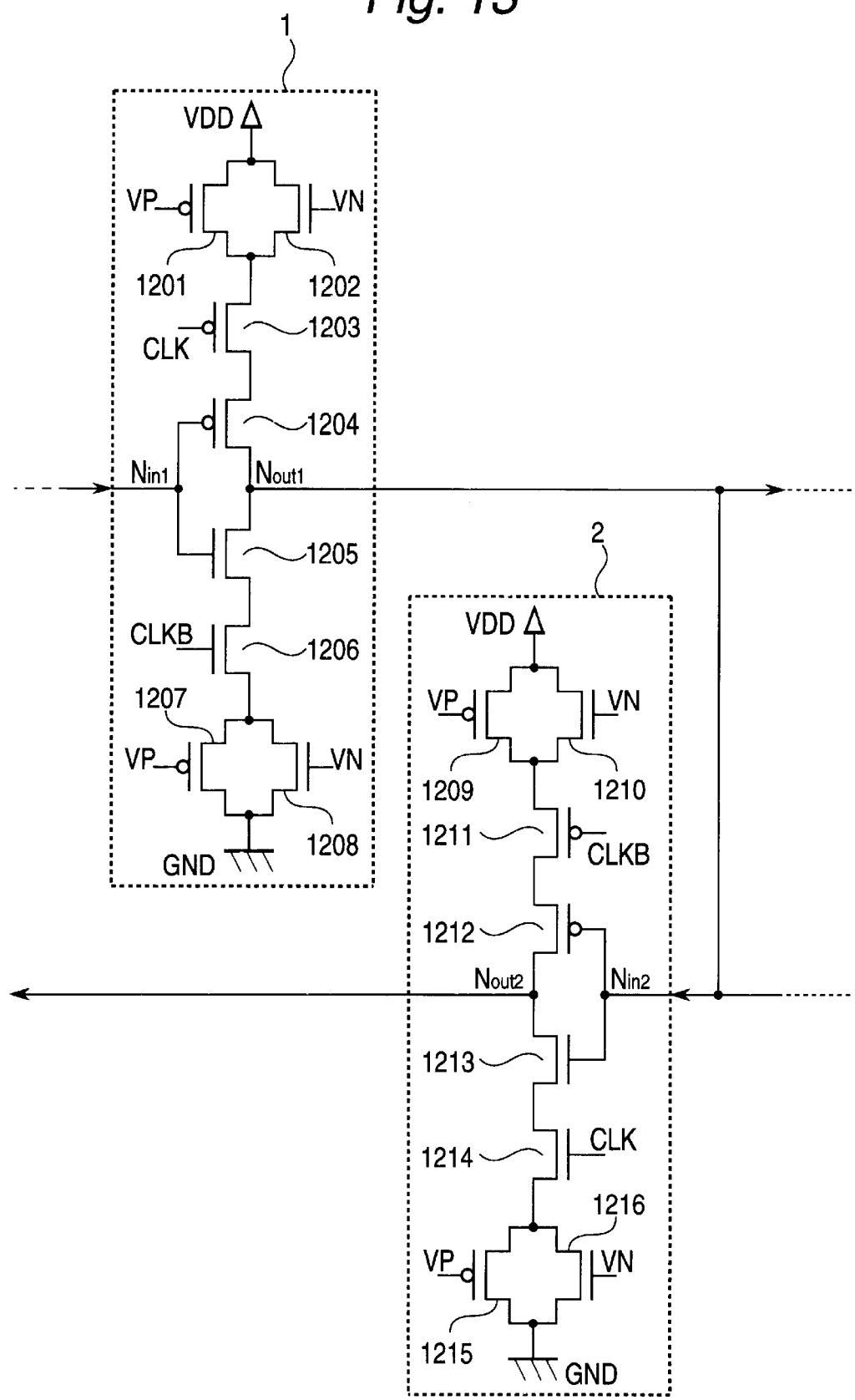
FIG. 13 is a circuit diagram illustrating one portion of delay circuit arrays in a sixth embodiment of the synchronous delay circuit in accordance with the present invention.

Referring to FIG. 13, there is shown a circuit diagram similar to FIG. 2 but illustrating one portion of delay circuit arrays in a sixth embodiment of the synchronous delay circuit in accordance with the present invention.

Specifically, in the shown sixth embodiment, each of the unitary delay circuits 1 in the delay circuit array 101 includes a CMOS transfer gate composed of a P-channel MOS transistor 1201 having a source connected to a high voltage power supply line VDD and a gate receiving a control voltage VP and an N-channel MOS transistor 1202 having a drain connected to the high voltage power supply line VDD, a gate receiving a control voltage VN and a source connected to a drain of the P-channel MOS transistor 1201, a P-channel MOS transistor 1203 having a gate receiving the control clock CLK and a source connected to the drain of the P-channel MOS transistor 1201, a P-channel MOS transistor 1204 having a gate connected to an input node Nin1, a drain connected to an output node Nout1 and a source connected to a drain of the P-channel MOS transistor 1203, an N-channel MOS transistor 1205 having a gate connected to the input node Nin1 and a drain connected to the output node Nout1, a P-channel MOS transistor 1206 having a gate receiving the inverted control clock CLKB and a drain connected to a source of the P-channel MOS transistor 1205, and another CMOS transfer gate composed of a P-channel MOS transistor 1207 having a source connected to a source of the N-channel MOS transistor 1206, a drain connected to ground and a gate receiving the control voltage VP and an N-channel MOS transistor 1208 having a drain connected to the source of the P-channel MOS transistor 1207, a source connected to the ground and a gate receiving the control voltage VN.

On the other hand, each of the unitary delay circuits 2 in the delay circuit array 102 includes a CMOS transfer gate composed of a P-channel MOS transistor 1209 having a source connected to the high voltage power supply line VDD and a gate receiving the control voltage VP and an N-channel MOS transistor 1210 having a drain connected to the high voltage power supply line VDD, a gate receiving the control voltage VN and a source connected to a drain of the P-channel MOS transistor 1209, a P-channel MOS transistor 1211 having a gate receiving the inverted control clock CLKB and a source connected to the drain of the P-channel MOS transistor 1209, a P-channel MOS transistor 1212 having a gate connected to an input node Nin2, a drain connected to an output node Nout2 and a source connected to a drain of the P-channel MOS transistor 1211, an N-channel MOS transistor 1213 having a gate connected to the input node Nin2 and a drain connected to the output node Nout2, a P-channel MOS transistor 1214 having a gate receiving the control clock CLK and a drain connected to a source of the P-channel MOS transistor 1214, and another CMOS transfer gate composed of a P-channel MOS transistor 1215 having a source connected to a source of the N-channel MOS transistor 1214, a drain connected to the ground and a gate receiving the control voltage VP and an N-channel MOS transistor 1216 having a drain connected to the source of the P-channel MOS transistor 1215, a source connected to the ground and a gate receiving the control voltage VN.

As seen from comparison between FIG. 2 and FIG. 13, the sixth embodiment is different from the first embodiment only in that each of the resistors in each unitary delay circuit of the first embodiment is replaced with the CMOS transfer gate. In this sixth embodiment, by controlling the control voltage VP supplied to the P-channel MOS transistors 1201, 1207, 1209 and 1215 of the CMOS transfer gates and the control voltage VN supplied to the P-channel MOS transistors 1202, 1208, 1210 and 1216 of the CMOS transfer gates, each CMOS transfer gate can have a controlled ON resistance, freely from the variation inevitable in the semiconductor device manufacturing process. Accordingly, the CMOS transfer gate acts as the independent current limiting means, and therefore, an effect near to the insertion of the resistors in the first to fifth embodiments can be obtained. Therefore, it is possible to increase the delay time per one unitary delay circuit while suppressing the increase in the difference between the charging time and the discharging time. Accordingly, an advantage similar to that obtained in the first embodiment can be obtained.

In addition, in each of the embodiments shown in FIGS. 8, 9 and 10, each resistor can be replaced with the CMOS transfer gate as in this sixth embodiment. In this case, a similar advantage can be obtained. Furthermore, each resistor in the fifth embodiment can be replaced with the CMOS transfer gate as in this sixth embodiment.

As seen from the above, according to the present invention, the area of the delay circuit arrays required to obtain a desired delay time can be reduced while minimizing the increase of the jitter. This is because the current drive capability of each unitary delay circuit is decreased by adding the independent current limiting means such as the resistor in series to an output node charging/discharging current path of the clocked inverter which constitutes each unitary delay circuit in the synchronous delay circuit.

The invention has thus been shown and described with reference to the specific embodiments. However, it should be noted that the present invention is in no way limited to the details of the illustrated structures but changes and modifications may be made within the scope of the appended claims.

What is claimed is:

1. A synchronous delay circuit including a delay circuit array comprising a plurality of cascade-connected unitary delay circuits, wherein said plurality of cascade-connected unitary delay circuits further comprise alternately cascade-connecting a plurality of first clocked inverters each including exclusively P-channel transistors and a plurality of second clocked inverters each including exclusively N-channel transistors, and wherein each said exclusively P-channel MOS transistor includes a switching P-channel MOS transistor and a first current limiting means connected in a single series connection between a high voltage power supply and an output node of one of said first clocked inverters, and wherein each said exclusively N-channel MOS transistor includes a switching N-channel MOS transistor and a second current limiting means connected in a single series connection between a ground voltage power supply and an output node of one of said second clocked inverters.

2. A synchronous delay circuit, as claimed in claim 1 wherein said first and second current limiting means connected in series for charging and discharging includes a resistor.

3. A synchronous delay circuit, as claimed in claim 1 wherein said first and second current limiting means connected in series for charging and discharging includes a CMOS transfer gate having a gate receiving at least a control voltage.

* * * * *